(12) United States Patent
Nagahama

(10) Patent No.: US 7,838,831 B2
(45) Date of Patent: Nov. 23, 2010

(54) SUBSTRATE INSPECTION APPARATUS, SUBSTRATE INSPECTION METHOD AND SEMICONDUCTOR DEVICE MANUFACTURING METHOD

(75) Inventor: Ichirota Nagahama, Koga (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/053,174

(22) Filed: Mar. 21, 2008

(65) Prior Publication Data

US 2008/0231856 A1 Sep. 25, 2008

(30) Foreign Application Priority Data

Mar. 23, 2007 (JP) .............................. 2007-076957

(51) Int. Cl.
*G01N 23/00* (2006.01)
(52) U.S. Cl. .................... 250/310; 250/311; 250/492.1; 250/492.22; 430/5; 438/707; 438/774; 356/392; 356/393; 356/394
(58) Field of Classification Search ................ None
See application file for complete search history.

(56) References Cited

U.S. PATENT DOCUMENTS

| | | | | |
|---|---|---|---|---|
| 4,264,822 A | * | 4/1981 | Ueno et al. ............... | 250/492.3 |
| 4,528,452 A | * | 7/1985 | Livesay ................... | 250/491.1 |
| 4,654,649 A | * | 3/1987 | Kojima et al. ............. | 345/205 |
| 4,851,097 A | * | 7/1989 | Hattori et al. ............ | 204/192.33 |
| 4,983,830 A | * | 1/1991 | Iwasaki ................... | 850/1 |
| 5,004,927 A | * | 4/1991 | Nakagawa ............... | 250/492.2 |
| 5,022,977 A | * | 6/1991 | Matsuoka et al. ........ | 204/298.16 |
| 5,055,696 A | * | 10/1991 | Haraichi et al. .......... | 250/492.2 |
| 5,214,282 A | * | 5/1993 | Yamaguchi et al. ........... | 850/16 |
| 5,350,649 A | * | 9/1994 | Okamoto ................ | 430/5 |
| 5,484,671 A | * | 1/1996 | Okamoto ................ | 430/5 |
| 5,576,833 A | * | 11/1996 | Miyoshi et al. ........... | 356/394 |
| 5,796,111 A | * | 8/1998 | Mahoney ................. | 250/492.2 |
| 6,214,738 B1 | * | 4/2001 | Aiba et al. ................ | 438/707 |

(Continued)

FOREIGN PATENT DOCUMENTS

JP 4-242060 8/1992

(Continued)

OTHER PUBLICATIONS

K. Tsuno, "Simulation of a Wien filter as beam separator in a low energy electron microscope," Ultramicroscopy 55 (1994), pp. 127-140.

*Primary Examiner*—David A Vanore
(74) *Attorney, Agent, or Firm*—Finnegan, Henderson, Farabow, Garrett & Dunner, L.L.P.

(57) ABSTRACT

A substrate inspection method includes forming a conductive thin film on a surface of an inspection target substrate with a pattern formed thereon, generating an electron beam and irradiating the substrate having the thin film formed thereon with the electron beam, detecting at least any of secondary electrons, reflected electrons and backscattered electrons released from the surface of the substrate and outputting signals constituting an inspection image, and selecting at least any of a material, a film thickness and a configuration for the thin film, or at least any of a material, a film thickness and a configuration for the thin film and an irradiation condition with the electron beam according to an arbitrary inspection image characteristic so that an inspection image according to an inspection purpose can be obtained.

18 Claims, 4 Drawing Sheets

U.S. PATENT DOCUMENTS

| | | | |
|---|---|---|---|
| 6,319,321 B1 * | 11/2001 | Hiraga et al. | 118/666 |
| 6,541,386 B2 * | 4/2003 | Aiba et al. | 438/707 |
| 6,548,412 B2 * | 4/2003 | Fudoji et al. | 438/703 |
| 6,677,587 B2 * | 1/2004 | Kohama | 850/9 |
| 6,781,125 B2 * | 8/2004 | Tokuda et al. | 850/1 |
| 6,909,092 B2 * | 6/2005 | Nagahama et al. | 850/10 |
| 6,914,008 B2 * | 7/2005 | Den et al. | 438/707 |
| 6,914,444 B2 * | 7/2005 | Yamada | 324/751 |
| 6,949,478 B2 * | 9/2005 | Ohmi et al. | 438/774 |
| 6,958,477 B2 * | 10/2005 | Kohama | 850/1 |
| 6,992,290 B2 * | 1/2006 | Watanabe et al. | 250/310 |
| 7,075,072 B2 * | 7/2006 | Hatakeyama et al. | 250/310 |
| 7,098,457 B2 * | 8/2006 | Nagahama et al. | 250/310 |
| 7,212,017 B2 * | 5/2007 | Watanabe et al. | 324/751 |
| 7,241,993 B2 * | 7/2007 | Nakasuji et al. | 250/310 |
| 7,323,814 B2 * | 1/2008 | Miyazaki et al. | 313/495 |
| 7,351,969 B2 * | 4/2008 | Watanabe et al. | 250/310 |
| 7,391,036 B2 * | 6/2008 | Hatakeyama et al. | 250/492.2 |
| 7,411,191 B2 * | 8/2008 | Nakasuji et al. | 250/310 |
| 7,439,502 B2 * | 10/2008 | Nakasuji et al. | 250/306 |
| 7,449,691 B2 * | 11/2008 | Hatakeyama et al. | 250/310 |
| 7,550,750 B2 * | 6/2009 | Tokuda et al. | 250/492.21 |
| 7,592,586 B2 * | 9/2009 | Watanabe et al. | 250/251 |
| 2005/0205783 A1 * | 9/2005 | Nagahama et al. | 250/311 |
| 2007/0114463 A1 * | 5/2007 | Nakasugi et al. | 250/492.23 |
| 2007/0278418 A1 * | 12/2007 | Zani et al. | 250/432 R |
| 2007/0278419 A1 * | 12/2007 | Zani et al. | 250/432 R |
| 2008/0173814 A1 * | 7/2008 | Watanabe et al. | 250/310 |
| 2008/0265159 A1 * | 10/2008 | Hatakeyama et al. | 250/310 |
| 2009/0032708 A1 * | 2/2009 | Nakasuji et al. | 250/310 |
| 2009/0042106 A1 * | 2/2009 | Nagamura et al. | 430/5 |
| 2009/0101816 A1 * | 4/2009 | Noji et al. | 250/310 |
| 2009/0212213 A1 * | 8/2009 | Nakasuji et al. | 250/310 |
| 2010/0019149 A1 * | 1/2010 | Watanabe et al. | 250/310 |

FOREIGN PATENT DOCUMENTS

| | | |
|---|---|---|
| JP | 11-326247 | 11/1999 |
| JP | 2004-354084 | 12/2004 |

* cited by examiner

WIRING-OPENED DEFECT

WIRING-SHORTED DEFECT

WIRING-SHRINKING DEFECT

WIRING-PROJECTING DEFECT

SUBSTRATE INSPECTION APPARATUS, SUBSTRATE INSPECTION METHOD AND SEMICONDUCTOR DEVICE MANUFACTURING METHOD

CROSS REFERENCE TO RELATED APPLICATION

This application is based upon and claims the benefit of priority from the prior Japanese Patent Application No. 2007-076957, filed on Mar. 23, 2007, the entire contents of which are incorporated herein by reference.

BACKGROUND OF THE INVENTION

1. Field of the Invention

The present invention relates to a substrate inspection apparatus, a substrate inspection method and a semiconductor device manufacturing method, and is directed to, for example, a substrate inspection and a pattern measurement using an electron beam.

2. Related Background Art

In inspections and pattern measurements of semiconductor wafers, as the design rules are becoming finer in recent years, there is an increased need for inspections and measurements using an electron beam, which is favorable in high-resolution inspections.

Since a wafer surface is electrically charged in some manner, an electron beam-used substrate inspection has a problem in that non-uniformity occurs in the amount of at least any of secondary electrons, reflected electrons and backscattered electrons (hereinafter, simply referred to as "secondary electrons, etc.") generated on the wafer surface as a result of irradiation with electron beam that can reach a detector, causing distortion, blurring or shading in the inspection image of a pattern (for example, see Japanese Patent Laid-Open No. 11 (1999)-326247, paragraphs [0006] to [0011], and FIGS. 10 and 11). It also has a problem in that the amount of secondary electrons, etc., that can reach a detector is decreased due to distortion of the trajectory of the secondary electrons, etc., caused as a result of a potential gradient that is not parallel to the wafer surface locally occurring depending on the material and structure of the wafer surface layer, thereby lowering the inspection sensitivity and increasing errors in defect determination (for example, see Japanese Patent Laid-Open No. 2004-354084, paragraph [0005] and [0006], and FIGS. 15 and 16). These problems are especially pronounced in the field of inspection and measurement of patterns formed of insulating materials such as resists.

SUMMARY OF THE INVENTION

According to a first aspect of the present invention, there is provided a substrate inspection apparatus comprising:

a film-forming device which forms a conductive thin film on a surface of an inspection target substrate with a pattern formed thereon;

an imaging device which generates an electron beam, irradiates the substrate having the thin film formed thereon with the electron beam, detects at least any of secondary electrons, reflected electrons and backscattered electrons released from the surface of the substrate and outputs signals constituting an inspection image; and a controller which selects at least any of a material, a film thickness and a configuration for the thin film, or at least any of a material, a film thickness and a configuration for the thin film and an irradiation condition with the electron beam according to an arbitrary inspection image characteristic so that an inspection image according to an inspection purpose can be obtained, to generate a control signal, and supplies the generated control signal to the film-forming device, or the film-forming device and the imaging device.

According to a second aspect of the present invention, there is provided a substrate inspection method comprising:

forming a conductive thin film on a surface of an inspection target substrate with a pattern formed thereon;

generating an electron beam and irradiating the substrate having the thin film formed thereon with the electron beam;

detecting at least any of secondary electrons, reflected electrons and backscattered electrons released from the surface of the substrate and outputting signals constituting an inspection image; and selecting at least any of a material, a film thickness and a configuration for the thin film, or at least any of a material, a film thickness and a configuration for the thin film and an irradiation condition with the electron beam according to an arbitrary inspection image characteristic so that an inspection image according to an inspection purpose can be obtained.

According to a third aspect of the present invention, there is provided a semiconductor device manufacturing method comprising:

extracting a substrate from a lot and inspect it using a substrate inspection method;

if the inspection target substrate is determined to be non-defective as result of the inspection, performing a remaining manufacturing process on a remaining substrate in the lot to which the inspection target substrate belongs;

if the inspection target substrate is determined to be defective as a result of the inspection, performing reworking where the reworking is possible, and if the inspection target substrate is determined to be non-defective as a result of a re-inspection, performing the remaining manufacturing process, and where the reworking is not possible, abandoning the substrate in the lot to which the inspection target substrate determined to be defective belongs, the substrate inspection method comprising:

forming a conductive thin film on a surface of an inspection target substrate with a pattern formed thereon;

generating an electron beam and irradiating the substrate having the thin film formed thereon with the electron beam;

detecting at least any of secondary electrons, reflected electrons and backscattered electrons released from the surface of the substrate, and outputting signals constituting an inspection image; and selecting at least any of a material, a film thickness and a configuration for the thin film, or at least any of a material, a film thickness and a configuration for the thin film and an irradiation condition with the electron beam according to an arbitrary inspection image characteristic so that an inspection image according to an inspection purpose can be obtained.

DETAILED DESCRIPTION OF THE INVENTION

Hereinafter, embodiments of the present invention will be described with reference to the drawings.

(1) Substrate Inspection Apparatus

Figure 1:
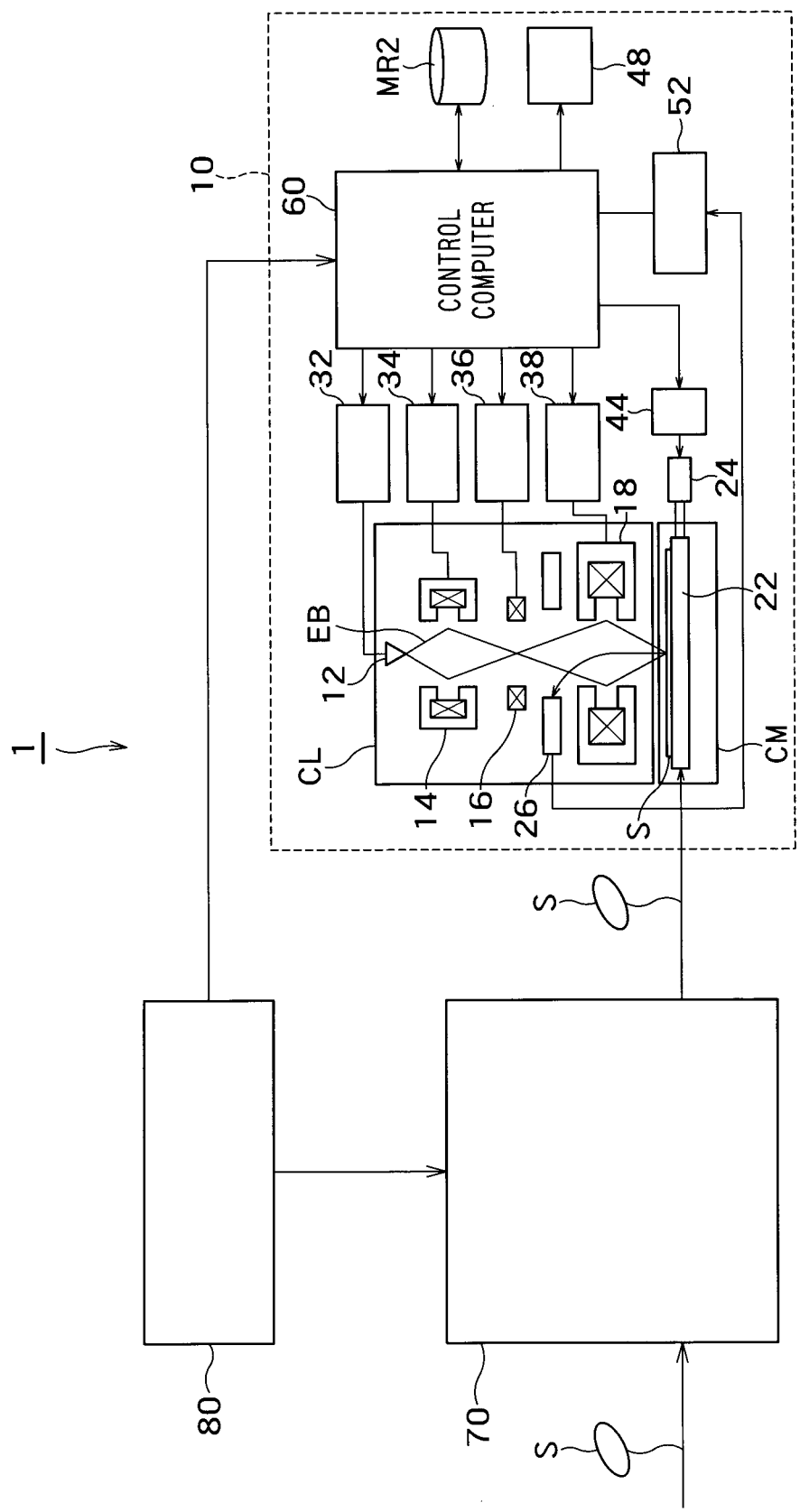
FIG. 1 is a block diagram illustrating a schematic configuration of an embodiment of a substrate inspection apparatus according to the present invention.

FIG. 1 is a block diagram illustrating a schematic configuration of an embodiment of a substrate inspection apparatus according to the present invention. A substrate inspection apparatus 1, shown in FIG. 1, comprises an electron microscope unit 10, a film-forming device 70 and a control unit 80.

The film-forming device 70 forms a conductive thin film, which will be described later, on an inspection target substrate S randomly extracted from an inspection lot. The electron microscope unit 10 irradiates the inspection target substrate S having the conductive thin film formed thereon with an electron beam, and detects secondary electrons, etc., and outputs a two-dimensional inspection image. In the present embodiment, the electron microscope unit 10 correspond to, for example, an imaging device.

The control unit 80 is connected to the electron microscope unit 10 and the film-forming device 70, and generates a control signal and supplies it to the electron microscope unit 10 and the film-forming device 70. This control signal is generated by selecting at least any of a material, a film thickness and a configuration for the conductive thin film, or at least any of a material, a film thickness and a configuration for the conductive thin film and electron beam irradiation conditions for the electron microscope unit 10 so that an inspection image with arbitrary characteristics can be obtained according to priorities of indexes representing the characteristics of the inspection image. Here, the indexes representing the characteristics of the inspection image include image distortion, image blurring, temporal change, S/N ratio and contrast. The electron beam irradiation conditions for the electron microscope unit 10 include electric current density and incident energy. In the present embodiment, the "S (Signal)" in the "SIN ratio" refers to the signal amount of secondary electrons, etc., that contribute the formation of the inspection image, and the "N (Noise)" in the "S/N ratio" refers to the signal amount of secondary electrons etc., that do not contribute the formation of the inspection image, such as background noise.

The electron microscope unit 10 includes an electron beam column CL, a sample chamber CM, various electron optical system control circuits 32, 34, 36 and 38, a X-Y stage 22 supporting the inspection target substrate S, a motor 24, a stage control circuit 44, a detector 26, a signal processor 52, a monitor 48, a control computer 60, and a type of a recording medium MR2 that is incorporated in the apparatus in advance or is attachable/detectable to/from the apparatus.

The control computer 60 is connected to the various electron optical system control circuits 32, 34, 36 and 38, the stage control circuit 44, and the signal processor 52 in addition to the recording medium MR2, and controls the entire electron microscope unit 10 via these circuits, etc.

The electron beam column CL includes an electron gun 12, a condenser lens 14, a scan lens 16 and an objective lens 18. The electron gun 12 is connected to the control computer 60 via the electron gun control circuit 32, generates an electron beam EB upon receipt of a control signal from the electron gun control circuit 32 and irradiates the inspection target substrate S with the electron beam EB. The condenser lens 14 is connected to the control computer 60 via the condenser lens control circuit 34, and excites a magnetic filed or an electric field upon receipt of a control signal from the condenser lens control circuit 34 and condenses the electron beam EB so as to have a proper beam diameter. The objective lens 18 is connected to the control computer 60 via the objective lens control circuit 38, and excites a magnetic field or an electric field by means of a control signal from the objective lens control circuit 38 and re-condenses the electron beam EB so that the electron beam comes into focus on the inspection target substrate S. The scan lens 16 is connected to the control computer 60 via the scan lens control circuit 36, and excites an electric field or a magnetic field for deflecting the electron beam EB upon receipt of a control signal from the scan lens control circuit 36, thereby two-dimensionally scanning the inspection target substrate S with the electron beam EB. The motor 24 is connected to the X-Y stage 22, and also to the control computer 60 via the stage control circuit 44, and operates upon receipt of a control signal from the stage control circuit 44 and moves the X-Y stage 22 within the X-Y plane.

The detector 26 detects the secondary electrons, etc., generated from the inspection target substrate S as a result of the electron beam EB irradiation. The signal processor detector 52 processes output signals from the detector 26 to convert them to data constituting a two-dimensional image representing the state of the inspection target substrate S surface, and supply it to the control computer 60. The control computer 60 stores the supplied image data in the memory MR2, and also shows it on a display of the monitor 48 as necessary.

The operation of the substrate inspection apparatus 1 shown in FIG. 1 will be described below as embodiments of a substrate inspection method according to the present invention.

(2) Substrate Inspection Method

Figure 2A:
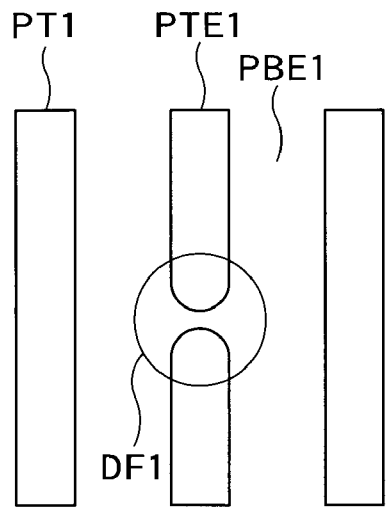
FIGS. 2A-2D are diagrams illustrating specific examples of pattern defects.
Figure 2B:
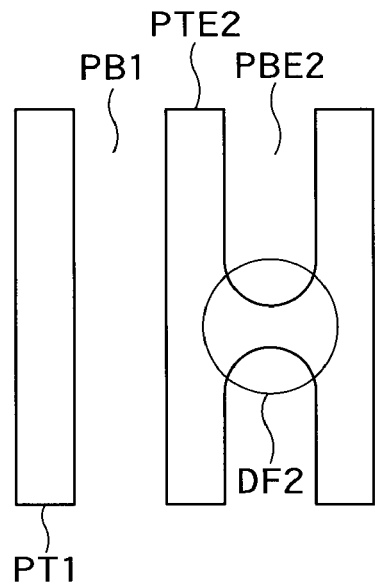

In substrate inspection, the priorities of the characteristics needed for an inspection image may differ depending on the type of the defect in the pattern. For example, since a wiring-opened defect and a wiring-shorted defect, shown in FIGS. 2A and 2B, are defects that are large in size, it is effective from the perspective of inspection efficiency to obtain an inspection image with an excellent contrast relying on the potential difference between a protrusion pattern constituting each resist and a bottom recess pattern constituting a silicon surface between the resists. This is because as the potential difference between a portion and another portion in the pattern is larger, the variation of the initial energy of the secondary electrons released from the substrate surface as a result of the electron beam irradiation become greater, and as a result, it becomes possible to obtain an image with a large difference in signal amount between the aforementioned portions, i.e., a large pattern contrast (see Japanese Patent Laid-Open No. 11 (1999)-326247). However, when the aforementioned potential difference is overly large, in a scan-type electron beam inspection apparatus, the secondary electrons released from the inspection target surface are forced to return to the inspection target surface due to the potential difference, so the amount of secondary electrons reaching the detector is decreased, making pattern contrast deterioration, especially, shading in a pattern edge portion easily occur. Also, in an image projection-type electron beam inspection apparatus, for the reasons of such as the trajectory of the secondary electrons, etc., to reach the detector being largely distorted (see Japanese Patent Laid Open No. 2004-354084), distortion, blurring or shading easily occurs in the inspection image. These cause wrong determinations or errors in an inspection image-based inspection and measurement, lowering the inspection and measurement performance. As described above, in order to enhance the pattern contrast, an adequate potential difference is required between the portions of the pattern. Meanwhile, in order to perform an inspection for minute shape defects in a pattern periphery (outer shape) by obtaining a pattern image with a high resolution at the edge portion, a state in which the secondary electrons, etc., released from the pattern edge are dominant in image formation is required, and in this case, it is necessary to reduce the potential difference between the pattern portions even though the pattern contrast is sacrificed to some extent. As described above, conventionally, the enhancement of the pattern contrast and the improvement of the other pattern image qualities (for example, reduction of distortion, blurring, gradation, and contrast irregularities) are in some sort of trade-off relationship, and accordingly, it is necessary to comprehensively evaluate the aforementioned issues to set film-formation, inspection and measurement conditions that achieve an ultimate inspection and measurement performance. Even within the same portion, when the potential becomes non-uniform, a difference may occur in the amount of secondary electrons, etc., causing a tone difference in inspection image in the corresponding region, which may also cause a wrong determination or error in an inspection and measurement, lowering the inspection and measurement performance.

Figure 2C:
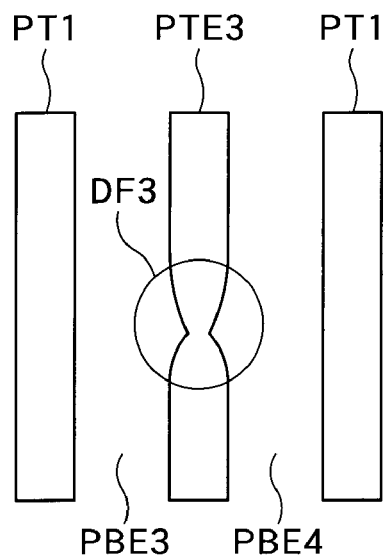
Figure 2D:
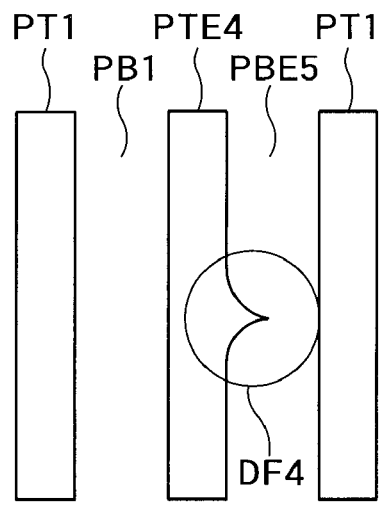

In the case of a wiring-shrinking defect and a wiring-projected defect, shown in FIGS. 2C and 2D, since their defect sizes are small, it is preferable to obtain an inspection image in which image formation by means of the secondary electrons, etc., released from the pattern edge is dominant. It should be noted that the term "pattern" in the present specification is used to express not only a protrusion pattern, but also a recess pattern. This is because, when a plurality of protruded members projecting upward from the substrate is formed by patterning the material formed on the substrate surface, for example, the protruded members themselves can be considered to constitute a protrusion pattern, and also, the adjacent protruded members and a substrate surface region between these adjacent protruded members can be considered to constitute a recess pattern, and the substrate surface region between the adjacent protruded members can be considered to be the bottom surface of the recess pattern. In the following description, the top surface portion of a protruded member is referred to as a pattern top surface portion, and the bottom surface of a recess pattern is referred to as a pattern bottom surface portion.

(i) FIRST EMBODIMENT

The present embodiment aims at obtaining an inspection image with an excellent contract resulting from a potential difference, and is an embodiment preferable for detecting large-sized defects.

Figure 3:
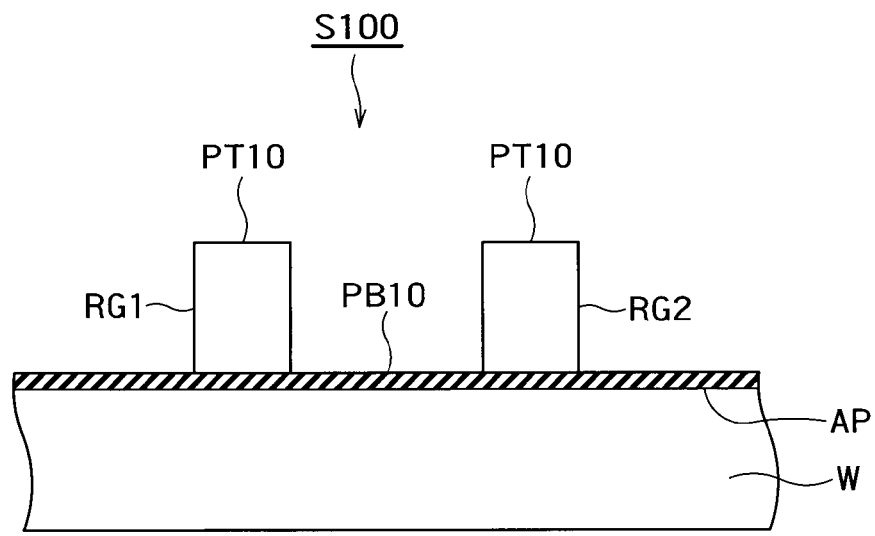
FIG. 3 is a schematic cross-sectional view of an example of an inspection target substrate.

FIG. 3 is a schematic cross-sectional view of an example of an inspection target substrate. A resist pattern inspection substrate S100, shown in FIG. 3, includes an antireflection film AP formed on a silicon wafer W, and resists RG1 and RG2 formed on the antireflection film AP as a result of patterning.

Figure 4:
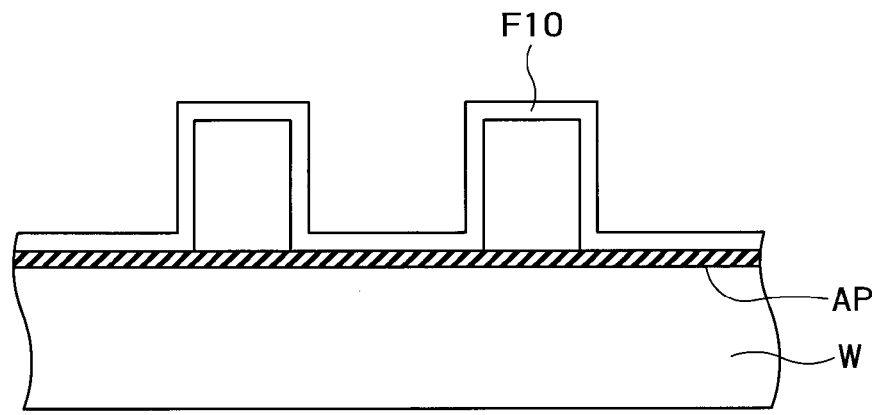
FIG. 4 is a diagram illustrating a first embodiment of a substrate inspection method according to the present invention.

First, as shown in FIG. 4, before the resist pattern inspection substrate S100 is transported to the sample chamber CM of the electron microscope unit 10, a titanium oxide ($TiO_2$) film F10 which is a high-resistance film, is formed on a surface of the substrate S100 via the film-forming device 70 using sputtering or vacuum vapor deposition.

As described above, as a result of forming a high-resistance conductive thin film on the inspection target substrate surface before irradiation with the electron beam EB, electrons or holes move to a direction to counteract charge distribution on the silicon wafer W surface by means of a potential shielding effect caused by the formation of the high-resistance film on the silicon wafer W, making it possible to provide a smaller potential difference between the pattern top surface portion PT10 and the pattern bottom surface portion PB10 at the time of the electron beam EB irradiation, compared to the case where no film is formed at all. As a result, a local potential gradient that had occurred in the vicinity of the resist edge becomes gentle, making it possible to prevent a decrease or temporal change in the signal amount of secondary electrons, etc. detected. More specifically, when an SEM apparatus is used as an imaging device as in the electron microscope unit 10 shown in FIG. 1, distortion, blurring and temporal change of an inspection image can be prevented.

Furthermore, the transfer amount of electrons or holes between the pattern top surface portion PT10 and the pattern bottom surface portion PB10 can be controlled by controlling the specific resistance of the titanium oxide ($TiO_2$) film F10 via the control unit 80, and the potential difference therebetween can be thereby generated in a stable manner, making it possible to obtain an inspection image with a potential contrast adequately enhanced between the pattern top surface portion PT10 and the pattern bottom surface portion PB10. The specific resistance of the titanium oxide ($TiO_2$) film F10 is controlled by adjusting the amount of oxygen added in the film formation in addition to the film-forming temperature via the control unit 80.

As described above, according to the present embodiment, a high-resistance thin film is formed on a surface of an inspection target substrate, preventing a sharp potential difference from being generated between the resist RG1 and the pattern bottom surface portion PB10 silicon, and maintaining an adequate potential difference in a stable manner, so it is possible to avoid distortion, or a gradation at a pattern boundary, of the inspection image while enhancing the potential contrast between the resist RG1 and the pattern bottom surface portion PB10 silicon. These effects can be optimized by controlling the film-thickness, the specific resistance and the secondary electron release ratio of the film formed on the substrate surface, and the electron beam irradiation conditions (electric current density and incident energy) for the electron microscope unit 10.

In the present embodiment, a titanium oxide ($TiO_2$) film is used as a material for the thin film on the substrate surface. However, the present invention is not limited at all to this kind of film, but another metal, for example, tantalum (Ta) or aluminum (Al), or tantalum oxide ($Ta_2O_5$), which is an oxide of the foregoing metal can also be used. Also, a carbon film may be formed by sputtering or vacuum vapor deposition. In the case of using a carbon film, the specific resistance of the carbon film may be controlled by adjusting the amount of hydrogen added during forming the carbon film.

(ii) SECOND EMBODIMENT

The present embodiment aims at obtaining a pattern inspection image with an excellent resolution at a pattern edge portion, and is an embodiment preferable for detecting minute shape defects in the pattern periphery (outer shape).

Figure 5:
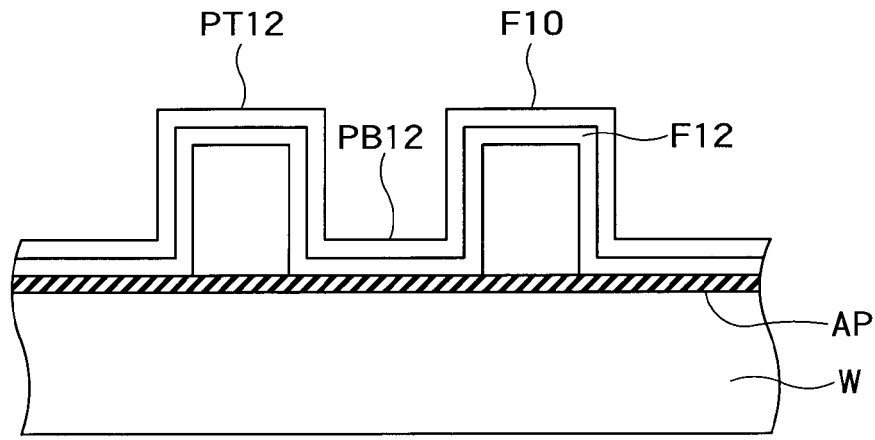
FIG. 5 is a diagram illustrating a second embodiment of a substrate inspection method according to the present invention.

First, a titanium (Ti) film F12 is formed on a surface of the substrate S100, shown in FIG. 3, via the film-forming device 70 using sputtering or vacuum vapor deposition, and subsequently a titanium oxide (TiO$_2$) film F10 is formed on the titanium (Ti) film F12 using sputtering or vacuum vapor deposition to form a thin film consisting of a laminate of a metal film and an oxidized metal film as shown in FIG. 5. The titanium oxide (TiO$_2$) film F10 may be formed after the surface of the titanium (Ti) film F12 is oxidized by an oxygen radical, etc.

According to the present embodiment, first, as a result of forming the titanium oxide (TiO$_2$) film F10, which is a high-resistance film, electrons or holes move to a direction to counteract charge distribution on the substrate surface by means of a potential shielding effect, making it possible to eliminate non-uniformity of electric charges, and consequently to reduce the surface potential difference. As a result, distortion, blurring and temporal change of the inspection image can be prevented. Furthermore, as a result of forming the titanium (Ti) film F12, which is in contact with the substrate surface, below the titanium oxide (TiO$_2$) film F10, the resistance value of the entire titanium oxide (TiO$_2$)/titanium (Ti) laminate is lowered compared to the case where a titanium oxide (TiO$_2$) film is used alone, allowing the electrons to easily move between the pattern top surface portion PT12 and the pattern bottom surface portion PB12, making it possible to reduce the potential difference therebetween. As a result, even when, for example, the potential difference between the pattern top surface portion and the pattern bottom surface portion is still large in the first embodiment described with reference to FIG. 4, it is possible to sufficiently reduce the potential difference therebetween, and since the image formation by the secondary electrons, etc., from the respective pattern edges becomes dominant, the resolution of the pattern edge portion is enhanced, and consequently, an inspection image preferable for detecting minute shape defects in the pattern periphery (outer shape) can be obtained. Also, since the titanium oxide (TiO$_2$) film F10 is formed on the titanium (Ti) film F12, the release amount of the secondary electrons, etc., can be increased compared to the case where a titanium (Ti) film, which is grounded via silicon, is formed alone, the S/N ratio of the inspection image can be improved.

Here, when the thickness of the titanium oxide (TiO$_2$) film F10 is set to a thickness allowing the electron beam EB to pass through, the electrons do not remain in the titanium oxide (TiO$_2$) film F10, making it possible to prevent a potential change.

The present embodiment refers to the case where titanium (Ti), and titanium oxide (TiO$_2$) to overly it are selected as materials for forming films on the inspection substrate S100 surface, but the present invention is not limited at all to these materials, a conductive or semi-conductive material can be used instead of titanium (Ti), and a material with a high secondary electron release ratio can be used instead of titanium oxide (TiO$_2$). For example, it is advantageous that a tantalum oxide (Ta$_2$O$_5$) film or an aluminum oxide (Al$_2$O$_3$) film is formed after forming a tantalum (Ta) film or an aluminum (Al) film on the surface of the film substrate S100 by sputtering or vacuum vapor deposition, because a film-forming source can be shared at the film-forming device 70.

(iii) THIRD EMBODIMENT

The present embodiment is characterized in providing variation in film thickness depending on regions in the surface of the pattern when forming a high-resistance thin film on a surface of an inspection target substrate.

Figure 6:
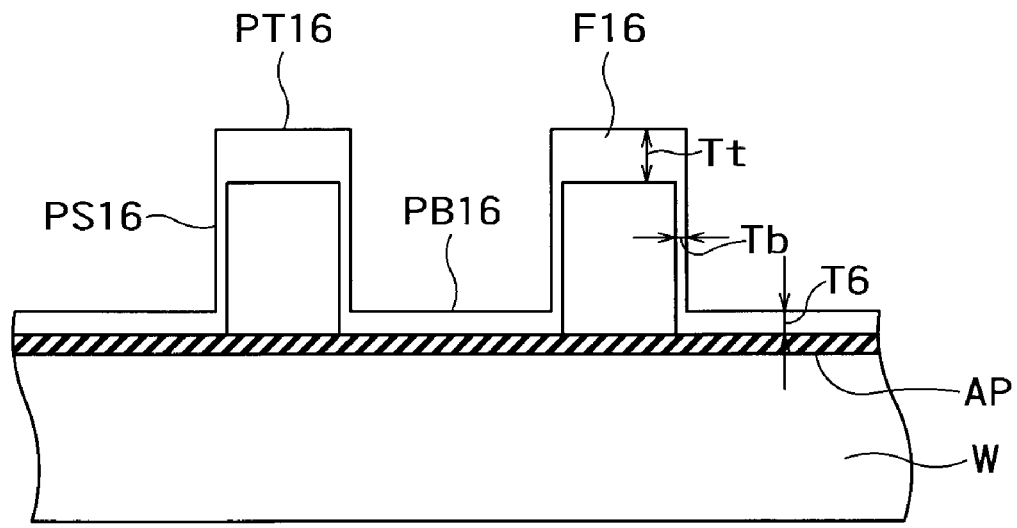
FIG. 6 is a diagram illustrating a third embodiment of a substrate inspection method according to the present invention.

FIG. 6 is an explanatory diagram of a substrate inspection method according to the present embodiment. When forming a titanium oxide (TiO$_2$) film F16 on the resist pattern inspection substrate S100 shown in FIG. 3, variation in film thickness is provided between the top surface, the side surface or the bottom surface of the pattern according to the inspection purpose. The control of the film-thicknesses of the respective surface regions is performed, for example, by the control unit 80 controlling the incident direction of sputter particles during sputtering performed by the film-forming device 70. More specifically, where the film thicknesses of a pattern top surface portion PT16, a side surface portion PS16 and a bottom surface portion PB16 of the titanium oxide (TiO$_2$) film F16 on the substrate S100 surface are "Tt", "Ts" and "Tb", respectively, the film thicknesses "Tt", "Ts" and "Tb" are controlled so that: a decrease or temporal change in the amount of detected signals during an electron beam inspection is prevented to reduce distortion, blurring and temporal change of the inspection image; and a potential difference is generated in a stable manner between the pattern top surface portion PT16 and the pattern bottom surface portion PB16, or the contrast between the pattern top surface portion PT16 and the pattern bottom surface portion PB16 becomes maximum. As the film thickness "Ts" of the pattern side surface portion PS16 is thinner, the amount of secondary electrons, etc., released from the edge of the pattern top surface portion PT16 is increased, so in order to generate a potential difference between the pattern top surface portion PT16 and the pattern bottom surface portion PB16 in a stable manner to enhance the pattern contrast, the film thickness "Ts" of the pattern side surface portion PS16 is important. Meanwhile, when enhancing the resolution of the pattern edge portion between the pattern top surface portion PT16 and the pattern bottom surface portion PB16 to detect minute shape defects in the pattern periphery (outer shape), the film thickness "Tb" of the pattern bottom surface portion PB16 is important. In order to obtain an inspection image that is excellent in potential contrast and surface shape contrast, a relationship of "Tt">"Tb">"Ts" can be considered to be proper.

(iv) FOURTH EMBODIMENT

The present embodiment is characterized in that a thin film having a multilayered structure that enables obtainment of an inspection image that is excellent in pattern contrast and resolution at a pattern edge portion is formed.

Figure 7:
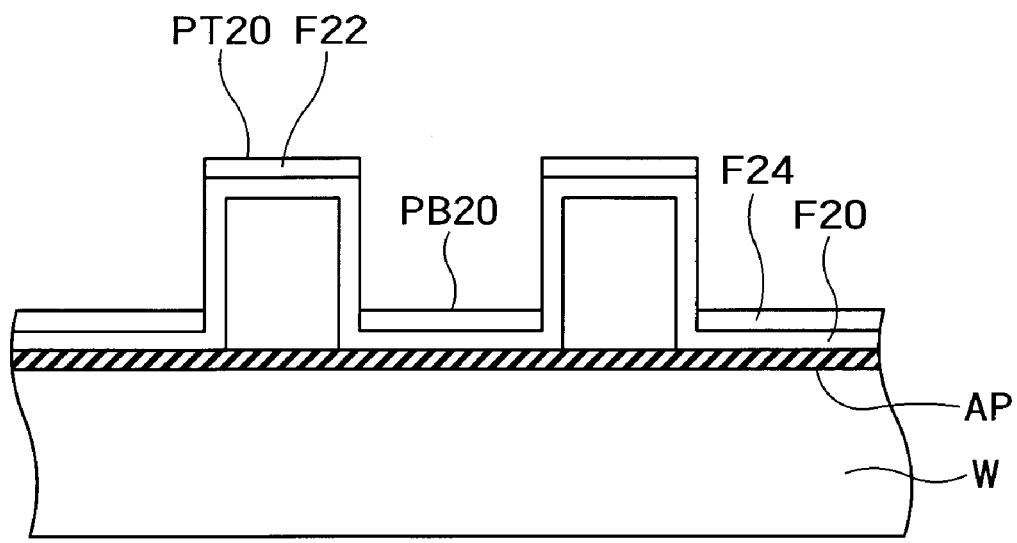
FIG. 7 is a diagram illustrating a fourth embodiment of a substrate inspection method according to the present invention.

An explanatory diagram of a substrate inspection method according to the present embodiment is shown in FIG. 7. A sample, shown in FIG. 7, is made by, first, forming an aluminum (Al) film F20 on a surface of the resist pattern inspection substrate S100 shown in FIG. 3 by means of sputtering or vacuum vapor deposition, further selectively forming an aluminum oxide (Al$_2$O$_3$) film F22 on a pattern top surface portion PT20, and selectively forming a carbon film F24 on a pattern bottom surface portion PB20.

As a result of forming a multilayered film having such structure on the inspection substrate S100, first, non-uniformity of the charges on the substrate S100 surface is eliminated by means of the low-resistance aluminum (Al) film F20, making it possible to reduce the potential difference between the pattern top surface portion PT20 and the pattern bottom surface portion PB20, which can prevent distortion, blurring, and temporal change of the inspection image, and as a result, the pattern image quality can be improved. Furthermore, by selecting aluminum oxide ($Al_2O_3$) as a material for the pattern top surface portion PT20, and selecting a carbon film as a material for the pattern bottom surface portion PB20, a clear difference in secondary electron release amount is generated between the pattern top surface portion PT20 and the pattern bottom surface portion PB20, making it possible to enhance the pattern contrast. In the present embodiment, the effect of enhancing the pattern contrast can be obtained by using a material with a large secondary electron release ratio for the pattern top surface portion PT20, and using a material with a small secondary electron release amount for the pattern bottom surface portion PB20.

For example, where the energy of the electron beam EB applied in the electron microscope unit 10 is 1 keV, the secondary electron release ratio between the aluminum oxide ($Al_2O_3$) and the carbon film is 6:0.72. Accordingly, signals approximately 8.3 times those detected for the pattern bottom surface portion PB20 can be detected for the pattern top surface portion PT20, so an inspection image with an excellent pattern contrast can be obtained. In the present embodiment, the pattern contrast relies on the amount of the secondary electrons, etc., released from the pattern top surface portion PT20 and the pattern bottom surface portion PB20 and detected, and the difference therebetween is determined according to the film thicknesses, the specific resistances and the secondary electron release ratio of the thin films formed at the respective portions, and the electron beam irradiation conditions (electric current density and incident energy). By controlling these factors via the control unit 80, the pattern contrast can be maximized, and as a result, the inspection and measurement performance can be improved. In the present embodiment, the pattern contrast is enhanced by selecting a material with a large secondary electron release amount for the pattern top surface portion PT20 and selecting a material with a small secondary electron release amount for the pattern bottom surface portion PB20, but conversely, the pattern contrast can also be enhanced by selecting a material with a small secondary electron release amount for the pattern top surface portion PT20, and selecting a material with a large secondary electron release amount for the pattern bottom surface portion PB20.

(3) Semiconductor Device Manufacturing Method

If the inspection target substrate S is determined to be non-defective by the aforementioned substrate inspection method, semiconductor devices can be manufactured with a high throughput and yield by performing a manufacturing process on the remaining substrates in the lot to which the inspection target substrate S belongs. If it is determined to be defective as a result of the inspection, reworking can be performed where it is possible, and if it is determined to be non-defective as a result of a re-inspection, the remaining manufacturing process is performed. Meanwhile, where reworking is not possible, the substrates in the lot to which the inspection target substrate that has been determined to be defective belongs are abandoned. If the thin film can be peeled off with no impact on the underlying layers, a semiconductor device can be manufactured by performing the manufacturing process also on the inspection target substrate S that has been determined to be non-detective itself as a result of the manufacturing process inspection.

What is claimed is:

1. A substrate inspection apparatus comprising:
    a film-forming device which forms a conductive thin film on a surface of an inspection target substrate with a pattern formed thereon;
    an imaging device which generates an electron beam, irradiates the substrate having the thin film formed thereon with the electron beam, detects at least any of secondary electrons, reflected electrons and backscattered electrons released from the surface of the substrate and outputs signals constituting an inspection image; and
    a controller which selects at least any of a material, a film thickness and a configuration for the thin film, or at least any of a material, a film thickness and a configuration for the thin film and an irradiation condition with the electron beam according to a priority of an index representing a characteristic of an inspection image, to generate a control signal, and supplies the generated control signal to the film-forming device, or the film-forming device and the imaging device.

2. The substrate inspection apparatus according to claim 1, wherein the index representing the characteristic comprises at least any of image distortion, image blurring, temporal change, S/N ratio and contrast.

3. The substrate inspection apparatus according to claim 1, wherein the electron beam irradiation condition comprises at least either of electric current density and incident energy.

4. The substrate inspection apparatus according to claim 1, wherein the thin film is an oxide film of a first metal formed so as to entirely cover the surface of the inspection target substrate,
    the index representing the characteristic is a contrast relying on a potential difference within the pattern, and
    the controller supplies a control signal to control a specific resistance of the oxide film to the film-forming device so that the potential difference within the pattern is generated in a stable manner.

5. The substrate inspection apparatus according to claim 1, wherein the film-forming device forms a laminate comprising a first thin film formed of a first metal so as to entirely cover the surface of the inspection target substrate, and a second thin film formed of an oxide film of the first metal so as to entirely cover the first thin film.

6. The substrate inspection apparatus according to claim 5, wherein the controller generates a control signal so that the second thin film has a thickness allowing the electron beam to pass through.

7. The substrate inspection apparatus according to claim 5, wherein the controller generates the control signal so that the film thickness varies depending on regions in the surface of the pattern.

8. The substrate inspection apparatus according to claim 1, wherein:
    the film-forming device forms a laminate comprising a first thin film formed of a metal film so as to entirely cover the surface of the inspection target substrate, a second thin film selectively formed on a top surface of the pattern, and a third thin film selectively formed on a bottom surface of the pattern; and
    the controller selects a material for the second thin film and a material for the third thin film so that their amounts of the detected signals differ from each other.

9. A substrate inspection method comprising:
    forming a conductive thin film on a surface of an inspection target substrate with a pattern formed thereon;
    generating an electron beam and irradiating the substrate having the thin film formed thereon with the electron beam;

detecting at least any of secondary electrons, reflected electrons and backscattered electrons released from the surface of the substrate and outputting signals constituting an inspection image; and selecting at least any of a material, a film thickness and a configuration for the thin film, or at least any of a material, a film thickness and a configuration for the thin film and an irradiation condition with the electron beam according to a priority of an index representing a characteristic of an inspection image.

10. The substrate inspection method according to claim 9, wherein the index representing the characteristic comprises at least any of image distortion, image blurring, temporal change, S/N ratio and contrast.

11. The substrate inspection method according to claim 9, wherein the electron beam irradiation condition comprises at least either of electric current density and incident energy.

12. The substrate inspection method according to claim 9, wherein the thin film is an oxide film of a first metal formed so as to entirely cover the surface of the inspection target substrate, the index representing the characteristic is a contrast relying on a potential difference within the pattern, and a specific resistance of the oxide film is selected so that the potential difference within the pattern is generated in a stable manner.

13. The substrate inspection method according to claim 9, wherein the thin film is a laminate comprising a first thin film formed of a first metal so as to entirely cover the surface of the inspection target substrate, and a second thin film formed of an oxide film of the first metal so as to entirely cover the first thin film.

14. The substrate inspection method according to claim 13, wherein the second thin film has a thickness allowing the electron beam to pass through.

15. The substrate inspection method according to claim 9, wherein the thin film has a film thickness which varies depending on regions in the surface of the pattern.

16. The substrate inspection method according to claim 9, wherein the thin film is a laminate comprising a first thin film formed of a metal film so as to entirely cover the surface of the inspection target substrate, a second thin film selectively formed on a top surface of the pattern, and a third thin film selectively formed on a bottom surface of the pattern; and a material for the second thin film and a material for the third thin film are selected so that their amounts of the detected signals differ from each other.

17. A semiconductor device manufacturing method comprising:

extracting a substrate from a lot and inspect it using a substrate inspection method;

if the inspection target substrate is determined to be non-defective as result of the inspection, performing a remaining manufacturing process on a remaining substrate in the lot to which the inspection target substrate belongs;

if the inspection target substrate is determined to be defective as a result of the inspection, performing reworking where the reworking is possible, and if the inspection target substrate is determined to be non-defective as a result of a re-inspection, performing the remaining manufacturing process, and where the reworking is not possible, abandoning the substrate in the lot to which the inspection target substrate determined to be defective belongs, the substrate inspection method comprising:

forming a conductive thin film on a surface of an inspection target substrate with a pattern formed thereon;

generating an electron beam and irradiating the substrate having the thin film formed thereon with the electron beam;

detecting at least any of secondary electrons, reflected electrons and backscattered electrons released from the surface of the substrate, and outputting signals constituting an inspection image; and selecting at least any of a material, a film thickness and a configuration for the thin film, or at least any of a material, a film thickness and a configuration for the thin film and an irradiation condition with the electron beam according to a priority of an index representing a characteristic of an inspection image.

18. The semiconductor device manufacturing method according to claim 17, wherein the thin film formed on the inspection target substrate can be peeled off with no impact on an underlying layer, and the manufacturing method further comprises performing the remaining manufacturing process on the inspection target substrate determined to be non-defective as a result of the inspection, after peeling the thin film off.

* * * * *